(12) United States Patent
Wurm et al.

(10) Patent No.: US 8,233,563 B2
(45) Date of Patent: Jul. 31, 2012

(54) OUTPHASING AMPLIFICATION OF DIGITAL MODULATED SIGNALS IN A RADIOFREQUENCY TRANSMISSION SYSTEM

(75) Inventors: Patrick Wurm, Strasbourg (FR); Claire Auer (Wurm), legal representative, Strasbourg (FR); Alexandre Shirakawa, San Jose, CA (US)

(73) Assignee: Commissariat a l'Energie Atomique Et Aux Energies Alternatives, Paris (FR)

( * ) Notice: Subject to any disclaimer, the term of this patent is extended or adjusted under 35 U.S.C. 154(b) by 125 days.

(21) Appl. No.: 12/832,269

(22) Filed: Jul. 8, 2010

(65) Prior Publication Data

US 2010/0272214 A1 Oct. 28, 2010

Related U.S. Application Data

(63) Continuation of application No. PCT/FR2009/050046, filed on Jan. 14, 2009.

(30) Foreign Application Priority Data

Jan. 15, 2008 (FR) ...................................... 08 50231

(51) Int. Cl.
*H04K 1/02* (2006.01)
*H04L 27/00* (2006.01)
(52) U.S. Cl. ........................................ 375/296; 375/295
(58) Field of Classification Search .................. 375/295, 375/297, 296
See application file for complete search history.

(56) References Cited

U.S. PATENT DOCUMENTS

| 6,317,468 | B1 * | 11/2001 | Meyer ............................ | 375/269 |
| 6,339,621 | B1 * | 1/2002 | Cojocaru et al. .............. | 375/247 |
| 2004/0266365 | A1 | 12/2004 | Hasson et al. | |
| 2006/0078067 | A1 | 4/2006 | Brobston | |
| 2006/0098762 | A1 * | 5/2006 | Wojtiuk ......................... | 375/308 |
| 2008/0014895 | A1 * | 1/2008 | Li et al. ......................... | 455/324 |
| 2009/0079514 | A1 * | 3/2009 | Jamneala et al. ............. | 333/133 |
| 2010/0142641 | A1 * | 6/2010 | Cathelin et al. ............... | 375/295 |
| 2011/0007836 | A1 * | 1/2011 | Schlee et al. .................. | 375/295 |

FOREIGN PATENT DOCUMENTS

WO 99/52206 A1 10/1999

OTHER PUBLICATIONS

Peter M. Asbeck et al., "*Synergistic Design of DSP and Power Amplifiers for Wireless Communications*," IEEE Transactions on Microwave Theory and Techniques, IEEE Service Center, Piscataway, NJ, vol. 49, No. 11, Nov. 1, 2001, pp. 2163-2169.

* cited by examiner

*Primary Examiner* — David C. Payne
*Assistant Examiner* — Brian J Stevens
(74) *Attorney, Agent, or Firm* — Burr & Brown

(57) ABSTRACT

Radiofrequency transmission system including a digital module producing a first complex digital signal quantised on N bits, a module transforming the first complex digital signal into two second complex digital signals with an identical and constant envelope that are phase-shifted with respect to one another, sigma-delta filters quantising the two second signals into third M bits signals, M being less than N, a digital-to-analogue converter converting the third signals into analogue signals, band-pass filters selectively filtering the analogue signals in a predetermined transmission frequency band, amplifiers amplifying the filtered analogue signals, and filters recombining the amplified analogue signals for transmission.

11 Claims, 8 Drawing Sheets

OUTPHASING AMPLIFICATION OF DIGITAL MODULATED SIGNALS IN A RADIOFREQUENCY TRANSMISSION SYSTEM

BACKGROUND OF THE INVENTION

1. Domain of the Invention

The present invention relates to the field of radiofrequency transmitters, especially those used in wireless communication terminals such as mobile telephones for example.

The invention relates, more especially, to reconfigurable radiofrequency transmitters which are capable of transmitting over a wide power range and using several transmission formats.

2. Description of the Related Art

In the field of wireless radio communication, there are numerous communication formats which use electromagnetic waves in the radiofrequency band such as the UHF, GSM, EDGE, WCDMA, 3G, etc. standards. Each of these standards is associated with a particular transmission frequency band (one talks of the UHF band, GSM band, 3G band, etc. for example).

Nevertheless, a radio transmitter which is suitable for transmitting in accordance with a particular standard is not generally suitable for transmitting according to another standard. For example, the architecture of a radio transmitter according to the GMSK standard is based on direct modulation and, to achieve this, comprises an analogue modulator followed by a power amplifier. In contrast, polar loop architectures are especially suitable for transmitting non-constant envelope signals such as the 8PSK modulation adopted for the EDGE standard. But the polar loop cannot transmit signals with a bandwidth larger than EDGE signals. On the other hand, only an architecture with direct modulation and a linear amplifier is usually feasible for wideband transmissions such as transmission according to the 3G and OFMD standards.

There are terminals equipped with several transmitters, each of which is dedicated to a particular standard, in order to overcome the incompatibilities between various radiofrequency transmission architectures. Such terminals are therefore bulky and poorly optimised. In addition, the speed of changeover from one type of transmission to another type of transmission is limited, using a terminal of this type for opportunistic use of radiofrequency spectrum is therefore difficult to envisage.

Moreover, terminals which use communication via electromagnetic waves in the radiofrequency band comprise a transmit module which feeds a signal to an antenna, the signal having been generated on the basis of data signals which are, generally speaking, digital.

In terms of performance, these transmit modules need to be analyzed in respect of various parameters. Thus, to the extent that the devices in which they are fitted are frequently portable, one important criterion is their power consumption because this has a direct influence on the device's battery life. Attempts are therefore generally made to achieve low power consumption.

For spectral occupation reasons, signals undergo both phase and amplitude modulation operations before transmission. However, generally speaking, non-constant amplitude signals or signals having a variable envelope impose constraints on the type of amplifier which can be used. In fact, it is preferable to use linear-response amplifiers to amplify non-constant amplitude signals in order to avoid distortion.

Unfortunately, linear amplifiers perform less well in terms of power consumption than non-linear amplifiers.

Moreover, bearing in mind the spectrum packing density of communication systems which share the same frequency band, it is essential to ensure that transmission systems generate extremely little interference in adjacent frequency bands by using highly selective output filtering.

At present, certain techniques have been developed in order to allow the use of non-linear amplifiers to amplify non-constant amplitude signals. A technique known as "outphasing" makes it possible to achieve satisfactory results. This technique involves using a variable-amplitude signal to generate two constant-amplitude signals having a phase difference which varies depending on the amplitude of the original signal.

These two intermediate signals which have a constant envelope and are generated on the basis of the basic signal can thus be amplified by non-linear amplifiers without any risk of introducing signal distortion because the amplitude information no longer exists.

After amplification, these two intermediate signals are added by a recombining stage. Thanks to the opposite phase difference of the two intermediate signals, this recombination makes it possible to obtain a variable-amplitude output signal having the same function as that of the original signal, but after amplification.

This "outphasing" technique, based on theoretical work described by CHIREIX in "*High power outphasing modulation*", in Proc IRE, Volume 23 November 1935, pages 1370 to 1392, has been the subject of various improvements, including that described in Document US 2006/0078067.

At present, amplifier modules which use the "outphasing" operating principle use signal recombining stages which employ passive components such as transformers, quarter wavelength transmission lines or magnetic couplers. Such components are inherently relatively bulky and perform poorly in the main and are therefore unsuitable for use in applications in mobile terminals.

SUMMARY OF THE INVENTION

The object of the present invention is to provide a solution to the above-mentioned problems by proposing a radiofrequency transmission system which has relatively compact overall dimensions, is rapidly reconfigurable in order to operate using several transmission formats, allows communication over a wide power range and performs well in terms of power consumption.

To achieve this, the object of the invention is a radiofrequency transmission system comprising:
  means of producing a complex digital signal quantised on N bits;
  means of transforming the complex digital signal into two complex digital signals with an identical and constant envelope that are phase-shifted with respect to one another;
  a digital processing pathway associated with each of the two complex constant-envelope digital signals and comprising at least some filtering means of the sigma-delta type for quantising on M bits signals travelling in the processing pathway, M being less than N;
  digital-to-analogue conversion means for converting the outputs of the digital processing pathways into analogue signals;
  means of selectively filtering (of the bandpass type) the analogue signals in a predetermined transmission frequency band;
  means of amplifying the filtered analogue signals; and
  means of recombining the amplified analogue signals.

In other words, the signal is modulated exclusively digitally. In fact, the transmitter can be reconfigured quickly at will because this only involves changing the way in which the signals are programmed.

Nevertheless, it should be noted that the number of quantisation bits must be reduced in order to obtain digital-to-analogue conversion at a high sampling frequency (which can be as high as several GHz). Otherwise the use of high-speed converters causes significant power consumption which is not compatible with certain envisaged applications, especially cellular telephones. In addition, 8- to 10-bit digital-to-analogue conversion is still confined to several tens of MHz.

A big reduction in the number of quantisation bits is accompanied by significant quantisation error which spreads uniformly over the entire spectrum, thus making the output signal inappropriate for radiofrequency communication.

Reducing the number of quantisation bits by using sigma-delta filtering has the effect of shaping the power spectrum of the quantisation noise. The filtering parameters thus define a frequency band over which the output signal has a good signal-to-noise ratio.

Once digital-to-analogue conversion has been performed, selective filtering of the signal in this frequency band makes it possible to obtain very limited noise outside this band or even eliminate such noise. A radiofrequency signal which is suitable for radiofrequency communication is thus obtained.

Moreover, the "outphasing" technique is used to transform non-constant envelope digital signals in order to produce signals with a high average power simply and without excessive power consumption. The signals thus obtained therefore have a constant envelope and are amplified after being converted into analogue signals, preferably by using a power amplifier which operates in saturation mode.

The system according to the invention therefore exploits the synergy between a high-frequency digital modulation technique by using sigma-delta filtering combined with selective bandpass filtering and a technique of the "outphasing" type which makes it possible to produce high average-power signals having a non-constant envelope.

According to one particular embodiment of the invention, the means of producing comprise means of generating a complex digital signal quantised on N bits and sampled at a first predetermined frequency and means of over-sampling (up-sampling) the complex digital signal sampled at the first frequency at a second predetermined frequency. In particular, the means of over-sampling realises over-sampling by decimation and interpolation.

In other words, the complex digital signal is modulated in the baseband and then over-sampled.

According to one particular embodiment of the invention, the digital processing pathway also comprises:
  means of repetition over-sampling capable of inserting L−1 zeroes between each sample of a digital input signal received by said means; and
  convolution means capable of convoluting the digital output signals of the repetition over-sampling means with a sequence quantised on M bits having a length equal to L or 2L samples and sampled L times the second frequency.

In other words, repetition over-sampling is performed in order to increase the radiofrequency transmission frequency, for example to increase it beyond the frequencies at which the sigma-delta type filtering means is capable of operating.

According to one particular embodiment of the invention, the sigma-delta type filtering means is capable of operating in the baseband region.

In other words, the low-pass type sigma-delta filter attenuates the quantisation noise at low frequencies and rejects it above these frequencies, thus guaranteeing a good signal-to-noise ratio in the baseband right up to its cut-off frequency.

According to one particular embodiment of the invention, the sigma-delta type filtering means is capable of operating in the bandpass region.

In other words, the means of generating the signal produces a digital signal which is no longer complex (in quadrature) but real (only one component) and already transposed, for example by a vector product, in the frequency band of the bandpass sigma-delta modulator. This modulator attenuates the quantisation noise in its frequency band and rejects it above this band, thus guaranteeing a good signal-to-noise ratio in its pass band.

The embodiment which uses a low-pass type sigma-delta filter makes it possible to free up a wider frequency band than the embodiment which uses a bandpass sigma-delta filter.

On the other hand, the embodiment based on the bandpass sigma-delta filter is more economical, simpler and not affected by the image frequency problems encountered with the embodiment based on the low-pass sigma-delta filter.

According to one particular embodiment of the invention, the digital processing pathway also comprises channel selection means.

In other words, using the selection means, it is possible to choose a channel having a frequency in the frequency band whereof the means of over-sampling by decimation and interpolation, possibly associated with means of repetition over-sampling, defines the centre channel. This provides an additional degree of flexibility when choosing the radiofrequency transmission frequency.

According to one particular embodiment of the invention, the digital processing pathway comprises means capable of producing a vector product between a complex digital signal received on an input and a phasor having a predetermined constant amplitude.

In other words, this vector product operation makes it possible to transpose a baseband complex digital signal to a complex digital signal at a higher frequency, this frequency being equal or less than half the sampling frequency. The result of this product is a complex number signal, the spectrum of which only contains positive frequency components. Selecting the amplitude of the phasor makes it possible to adjust the amplitude of the outbound signal.

According to one particular embodiment of the invention, the digital processing pathway comprises means of selecting the real part of the constant-envelope complex digital signal.

In other words, only the real part of the signal is preserved in cases where only that part is useful for subsequent digital processing.

According to one particular embodiment of the invention, the selective filtering means of the bandpass type comprises Bulk Acoustic Wave-Coupled Resonator Filters (BAW-CRF).

In other words, a compact, highly selective filter capable of selecting a frequency band of several tens of megahertz is used. The function of this filter is important in two respects. It makes it possible to eliminate the quantisation noise generated by the sigma-delta filter and restores the signal's constant-amplitude property, a property which it loses after it passes through the sigma-delta filter.

According to one particular embodiment of the invention, the means of amplification comprises power amplifiers which operate in saturation mode or compression mode.

In other words, the constant-envelope analogue signals allow the amplifiers to operate in their saturation regions where their energy efficiency is high and can reach 75%. Such amplification makes it possible to consume less energy than when using linear amplification.

According to one particular embodiment of the invention, the output impedance of the digital-to-analogue conversion means is matched to the input impedance of the selective filtering means.

In other words, one can optimise the power consumption of the digital circuit by good impedance matching between the digital circuitry and the analogue circuitry.

BRIEF DESCRIPTION OF THE DRAWINGS

The present invention will be made more readily understandable by the following description which is given merely by way of example and relates to the accompanying drawings in which identical references denote identical or analogous components and in which.

DETAILED DESCRIPTION OF THE INVENTION

Figure 1:
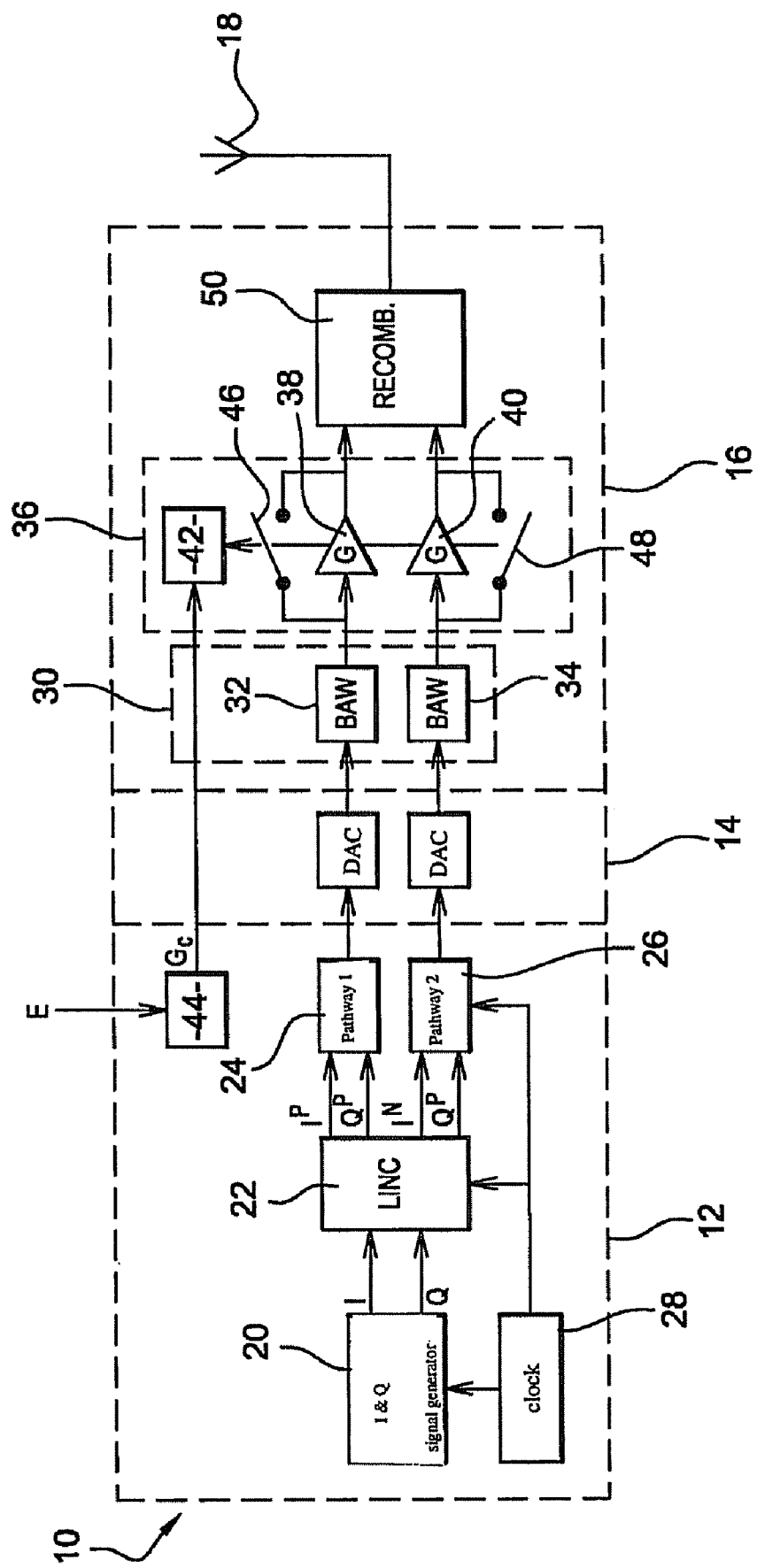
FIG. 1 is a general view of a radiofrequency transmission architecture according to the invention.

In FIG. 1, the general architecture of a radiofrequency transmission system according to the invention is denoted in its entirety by the reference 10.

System 10 according to the invention comprises a digital radiofrequency modulator 12, a digital-to-analogue conversion stage 14 which converts the digital signals produced by modulator 12 into analogue signals, an analogue circuit 16 which performs filtering, amplification and recombining of the signals produced by conversion stage 14 and a transmitting antenna 18 controlled by analogue circuit 12.

Digital radiofrequency modulator 12 comprises production module 20 which produces a complex digital signal S=I+jQ, having a real part I and an imaginary part Q. The complex digital signal S is sampled on N bits, e.g. six, eight or ten bits, in accordance with a predetermined radiofrequency transmission format such as, for instance, the GSM standard, the EDGE standard, the WCDMA standard or the OFDM standard. As is known in itself, complex digital signal S=I+jQ is modulated, especially amplitude modulated, and therefore does not have a constant envelope.

Transformation module 22, connected to production module 20, receives complex digital signal S=I+jQ and transforms it into two complex digital signals $S_{LINC}^P = I^P + jQ^P$ and $S_{LINC}^N = I^N + jQ^N$ which have an identical constant envelope and are phase shifted with respect to each other by using a digital technique referred to as "outphasing" as explained in the CHIREIX document cited above.

According to this technique, amplitude- and phase-modulated signal S is described by the following equation:

$$S(t) = A(t) \cdot \exp(j \cdot \omega t + \theta(t))$$

where $j^2 = -1$, t is time, A(t) is the modulated amplitude of signal s, $\omega$ is the angular frequency of the carrier wave of signal s and $\theta(t)$ is the modulated phase of signal s.

Signal S can be rewritten as $S(t) = S_{LINC}^P(t) + S_{LINC}^N(t)$, and signals $S_{LINC}^P$ and $S_{LINC}^N$ are given by the equations:

$$S_{LINC}^P(t) = A_0 \cdot \exp(j\phi(t) + j\omega t + j\theta(t))$$

$$S_{LINC}^N(t) = A_0 \cdot \exp(-j\phi(t) + j\omega t + j\theta(t))$$

where $$A_0 = \max\left(\frac{A(t)}{2}\right)$$

and $$\varphi(t) = \cos^{-1}\left(\frac{A(t)}{2A_0}\right).$$

Transformation module 22 therefore generates a pair of signals $S_{LINC}^P$ and $S_{LINC}^N$ which have a constant, identical envelope and are phase shifted with respect to each other.

Digital radiofrequency modulator 12 also comprises two parallel digital processing pathways 24, 26 which are connected to module 22 and each process one signal $S_{LINC}^P$ et $S_{LINC}^N$ respectively. More especially, channels 24, 26 produce, depending on the digital signals which they receive, constant-envelope signals, the sampling frequency of which is raised to an intermediate radiofrequency and quantised on M bits by using sigma-delta filtering, where M is a number of bits which is less than N.

Digital radiofrequency modulator 12 also comprises clock generator 28 which clocks the operation of the devices which have just been described as well as the sampling frequencies for the signals which flow through them.

Analogue circuit 16 comprises a first bandpass filtering stage 30. Stage 30 comprises bandpass filters 32, 34 which are highly selective, preferably BAW-CRF filters, these are described below in more detail. These filters 30, 32 strongly attenuate the spectrum of the signals produced by modulator 12 outside the selected radiofrequency transmission band, in particular in order to eliminate quantisation noise outside this band which is generated by the sigma-delta filtering.

Analogue circuit 16 also comprises power amplification stage 36. Amplification stage 36 comprises two amplifiers 38, 40 which apply gain G to the signals output by filtering stage 30; amplifiers 38, 40 are preferably implemented by using non-linear components which operate in saturation mode or slight compression mode.

Gain G of amplifiers 38, 40 is adjusted by gain control module 42 which receives gain set point $G_c$ from set point determination module 44 which is preferably integrated in digital modulator 12. Set point determination module 44 determines the gain set point as a function of the power required in order for the antenna to transmit as is known, for example, from communication according to the GSM standard, where the power of the transmitted signal depends on the distance between the wireless communication terminal and the base station.

Amplification stage 36 optionally comprises switches 46, 48 which are used to short-circuit amplifiers 38, 40 when no amplification is needed, thus making it possible to save energy in such situations.

Finally, analogue circuit 16 comprises recombining module 50 which is connected to amplification stage 36 and restores a phase- and amplitude-modulated signal "$S_{ANT}$" at around the transmission frequency.

Signal $s_{ANT}$ thus produced is substantially equal, for the chosen transmission frequency band, to $s_{ANT}(t) = G \cdot (I^A(t) + jQ^A(t)) \cdot \exp(j\omega_{RF} t)$, where $I^A$ and $Q^A$ are the analogue signals converted from signals I and Q and $\omega_{RF}$ is the angular frequency of the radiofrequency carrier.

Figure 2:
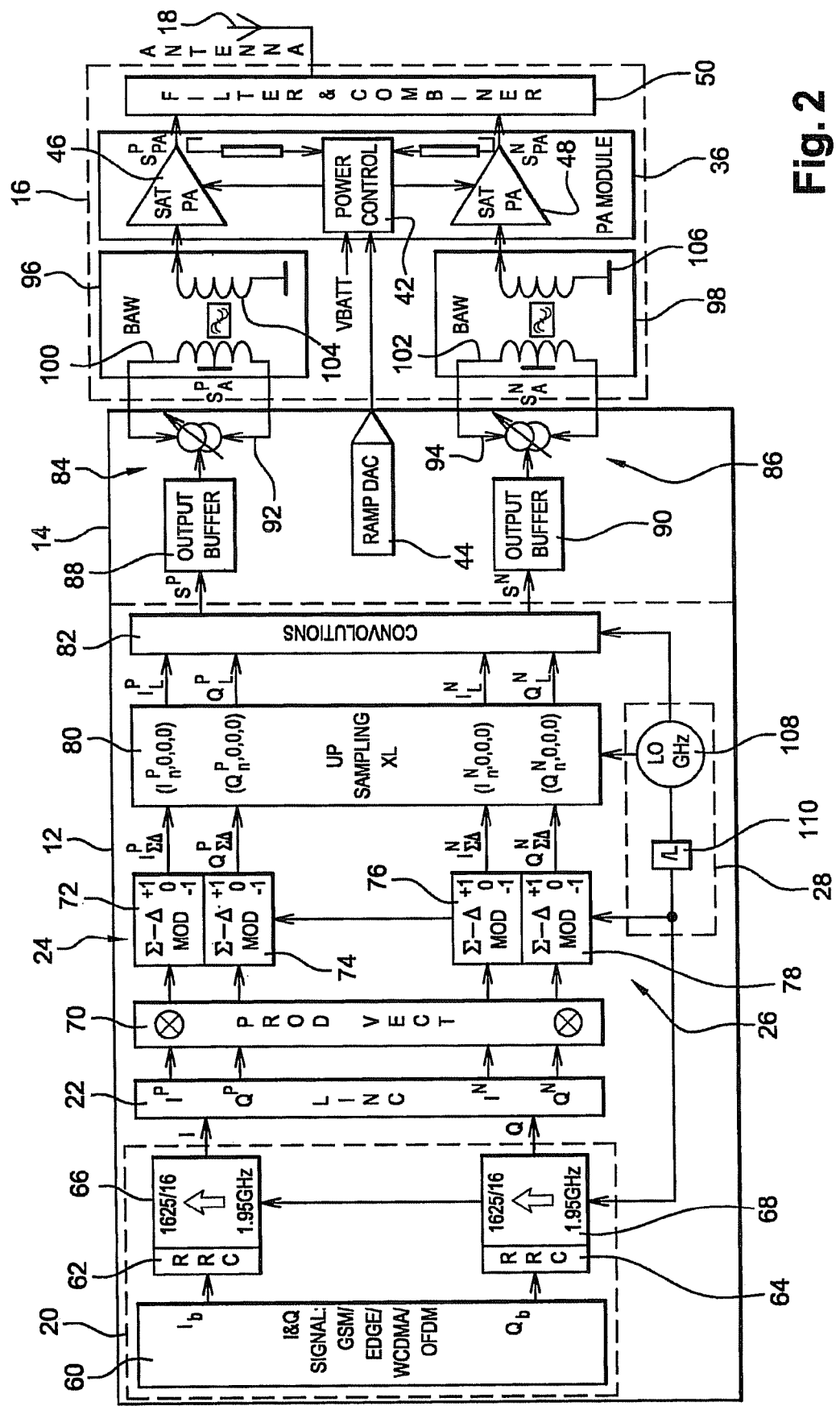
FIG. 2 is a schematic view of a first embodiment of the architecture shown in FIG. 1.

FIG. 2 illustrates a first embodiment of the system according to the invention.

According to this first embodiment, production module 20 for producing the complex digital signal S=I+jQ comprises a digital signal generator 60 which generates a complex digital signal $S_b = I_b + jQ_b$ in accordance with the selected transmission format.

Quadrature digital signals $I_b$ and $Q_b$ are quantised on N bits, for example on six, eight or ten bits, and sampled at a baseband frequency $f_1$. The useful information in signals $I_b$ and $Q_b$ therefore occupies a frequency band which is centered either side of the zero frequency.

Production module 20 optionally comprises two Root Raised Cosine (RRC) filters 62, 64 which are connected to digital signal generator 60 and receive signals $I_b$ and $Q_b$ respectively. RRC filters 62, 64 make it possible to limit spectral spreading of the signal to the width of the envisaged channel.

Production module 20 also comprises two over-samplers 66, 68 which are connected to RRC filters 62, 64 respectively and produce the real and imaginary parts I and Q. Each over-sampler 66, 68 raises the output signal of the RRC filter 62, 64 to which it is connected to a second sampling frequency $f_2$ by interpolation and decimation. The useful information in signals I and Q still occupies the same frequency band centered either side of the zero frequency. Such an over-sampler is familiar from the prior art.

Digital processing pathways 24, 26 each comprise a serial arrangement of channel selector 70, a pair of sigma-delta filters 72, 74, 76, 78, a repetition over-sampler 80 and a convolution filter 82.

Channel selector 70 forms, on demand, the vector product of each of the complex digital signals $S_{LINC}^P = I^P + jQ^P$ and $S_{LINC}^N = I^N + jQ^N$ obtained from transformation module 22 by a phasor having a frequency equal to the difference between the frequency of the desired transmission channel $f_{CH}$ and the frequency of centre channel $f_C$. The useful information is thus essentially comprised in a frequency band centred on frequency $(f_{CH} - f_C)$. The amplitude of the phasor is selected in order to adjust the amplitude of the signals on the input of sigma-delta filters 72, 74, 76, 78.

Sigma-delta filters 72, 74, 76, 78 are connected to the outputs of channel selector 70. Each sigma-delta filter quantises the signal which it receives on a number of bits which is less than M, for example on 1 or 1.5 bits, i.e. at two logic levels (0 and 1) or three logic levels (−1, 0, 1), while also shaping the power spectrum of the quantisation noise.

In this way, two complex digital signals quantised on M bits, $S_{\Sigma\Delta}^P = I_{\Sigma\Delta}^P + jQ_{\Sigma\Delta}^P$ and $S_{\Sigma\Delta}^N = I_{\Sigma\Delta}^N + jQ_{\Sigma\Delta}^N$, are obtained on the output of sigma-delta filters 72, 74, 76, 78.

The parameters of sigma-delta filters 72, 74, 76, 78 are selected depending on the chosen transmission format and hence the frequency band which corresponds to this format so that the signal requantised on M bits has a good signal-to-noise ratio in that band.

The parameters of the sigma-delta filters are preferably chosen so that the width of this frequency band represents a low percentage of the sampling frequency which the sigma-delta filter receives. For example, for transmission according to the WCDMA standard, the sigma-delta filter shapes the spectrum of the quantisation noise so that the signal-to-noise ratio is acceptable over a frequency band of 100 MHz whereas the filter operates at a sampling frequency of 1.95 GHz. This results after repetition over-sampling, in a good signal-to-noise ratio in the 1.90 GHz-2.00 GHz band which covers the WCDMA band (1.92 GHz-1.98 GHz).

The sigma-delta filters are conventional and are not explained in any further detail for the sake of brevity. For more details concerning the configuration and operation of such a filter, the reader can refer, for instance, to the document entitled "*An Overview of sigma delta converters*" by PERVEZ M. AZIZ, HENRIK V. SORENSEN & JAN VAN DER SPIEGEL, IEEE signal processing magazine, January 1996.

Repetition over-sampler 80 increases the sampling frequency for digital signals $I_{\Sigma\Delta}^P$, $Q_{\Sigma\Delta}^P$, $I_{\Sigma\Delta}^N$, $I_{\Sigma\Delta}^N$ received from sigma-delta filters 72, 74, 76, 78 by a predetermined factor L.

Over-sampling factor L is selected depending on the frequency band chosen for radiofrequency transmission purposes. Repetition over-sampler 80 has the dual function of raising the sampling frequency and repeating the spectrum of its input signal L times. The wanted signal that is contained in the baseband will also be repeated at the radiofrequency of the transmission channel.

To achieve this, L−1 zeros are inserted between two successive digital signals $I_{\Sigma\Delta}^P$. The same applies to $Q_{\Sigma\Delta}^P$, $I_{\Sigma\Delta}^N$, $I_{\Sigma\Delta}^N$. For example, for each sample $I_{\Sigma\Delta}^P(n)$ of signal $I_{\Sigma\Delta}^P$, where n is the $n^{th}$ sampling instant, a $[I_{\Sigma\Delta}^P(n)\ 0\ 0\ 0]$ sequence is produced. The numerical sequences $I_L^P$, $Q_L^P$, $I_L^N$, $I_L^N$ thus produced are L times longer and clocked L times faster than the digital signals $I_{\Sigma\Delta}^P$, $Q_{\Sigma\Delta}^P$, $I_{\Sigma\Delta}^N$, $I_{\Sigma\Delta}^N$ received by over-sampler 80.

The numerical sequences $I_L^P$, $Q_L^P$, $I_L^N$, $I_L^N$ are then convoluted using convolution filter 82 with sequences which are L or 2L long in order to obtain two numerical sequences of samples $S^P$ and $S^N$ which equal, for instance:

$$S^P(n) = [Q_{\Sigma\Delta}^P(n-1) I_{\Sigma\Delta}^P(n) - Q_{\Sigma\Delta}^P(n) - I_{\Sigma\Delta}^P(n)] \text{ and,}$$

$$S^N(n) = [Q_{\Sigma\Delta}^N(n) I_{\Sigma\Delta}^N(n) - Q_{\Sigma\Delta}^N(n) - I_{\Sigma\Delta}^N(n)].$$

Digital-to-analogue conversion stage 14 comprises two digital-to-analogue converters 84, 86 which are connected to convolution filter 82 in order to receive numerical sequences $S^P$ and $S^N$ respectively.

Each digital-to-analogue converter 84, 86 comprises an output buffer 88, 90 which converts the digital signals into current pulses as well as a current source 92, 94.

Current source 92, 94 is driven by output buffer 88, 90 and produces a positive current pulse when the output of buffer 88, 90 is positive, i.e. when the corresponding value of the numerical sequence $S^P$ and $S^N$ equals +1, a negative current pulse when the output of buffer 88, 90 is negative, i.e. when the corresponding value of the numerical sequence $S^P$ and $S^N$ equals −1, and a current which is substantially zero when the output of buffer 88, 90 is substantially zero, i.e. when the corresponding value of the numerical sequence $S^P$ and $S^N$ is zero.

It should also be noted that the digital-to-analogue converter is extremely simple, capable of operating at a very high frequency of 5 to 10 GHz and produces very short pulses.

Analogue circuit 16 comprises two BAW-CRF filters 96, 98. Input resonators 100, 102 of these filters are connected respectively to current sources 92, 94 of digital-to-analogue conversion stage 14. The terminals of output resonators 104, 106 of the BAW-CRF filters are connected to ground GND and to amplifiers 46, 48 respectively. A current pulse flowing through the input resonator of a BAW-CRF filter then creates, across the terminals of output resonator 104, 106 of the latter, a positive, negative or zero voltage depending on the value of the current pulse.

A selectively filtered voltage, i.e. a voltage whose spectral components outside the chosen transmission frequency band are attenuated, is thus obtained on the output terminals of each BAW-CRF filter prior to amplification by amplification stage 36.

Recombining module 50 adds the outputs of amplifiers 46, 48, thereby producing the control signal $s_{ANT}$ for antenna 18.

Finally, clock generator 28 of digital radiofrequency modulator 12 comprises a controllable clock 108 which operates at frequency $L.f_2$ and controls the operating frequency of repetition over-sampler 80 and of convolution filter 82. A frequency divider 110 is also provided. Frequency divider 110 divides the frequency of clock 108 by factor L and controls the operating frequency of decimation and interpolation over-samplers 66, 68 and of sigma-delta filters 72, 74, 76, 78.

This way, controlling the frequency of clock 108 and/or factor L makes it possible to adjust the radiofrequency transmission frequency over a wide radiofrequency spectrum.

Moreover, because the data format is set up in the baseband by appropriately programming signal generator 60, there is no need to provide dedicated circuits for every transmission standard and its associated frequency band.

Sigma-delta filters 72, 74, 76, 78 can usually operate in several modes, especially in baseband or bandpass mode.

Figure 3:
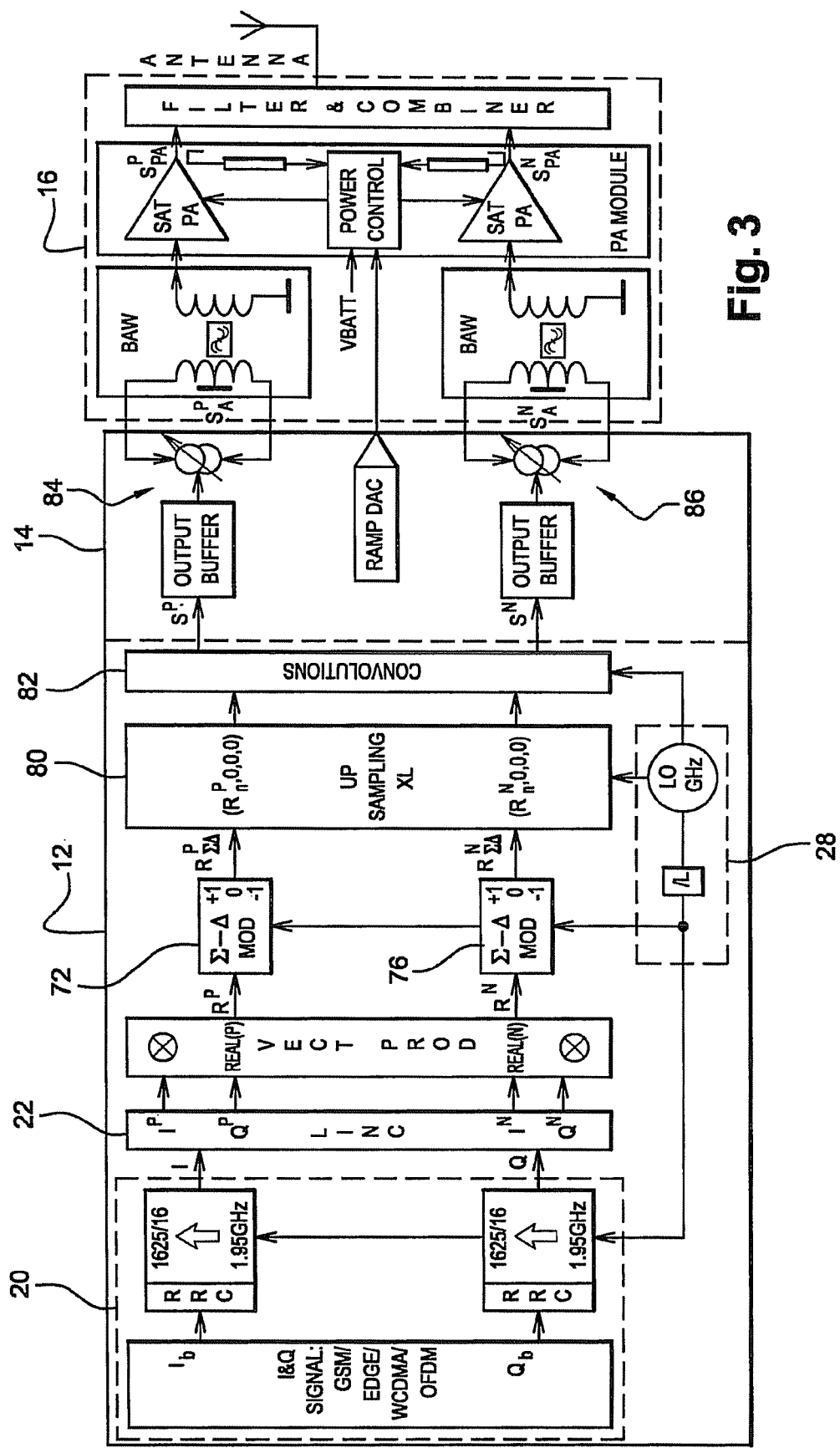
FIG. 3 is a schematic view of a second embodiment of the architecture shown in FIG. 1.

FIG. 3 illustrates a second embodiment of the system according to the invention.

This second embodiment differs from that described in relation to FIG. 2 in that the real part of each signal $S_{LINC}^P = I^P + jQ^P$ and $S_{LINC}^N = jQ^N$ is selected on the output of transformation module 22, for example by channel selector 70 which is modified in order to implement this function.

Two signals $R^P$ and $R^N$ are produced by channel selector 70, so each digital processing pathway only comprises a single bandpass sigma-delta filter 72, 74 which operates in bandpass mode.

Channel selector 70 forms, on demand, the vector product of the real parts $I^P$ and $I^N$ of each of the complex digital signals $S_{LINC}^P$ and $S_{LINC}^N$ obtained from transformation module 22 by a programmable-amplitude phasor whose frequency equals the difference between the frequency of the desired transmission channel $f_{CH}$ and the frequency of the centre channel $f_C$ to which the mid-band frequency $f_{BP}$ of sigma-delta filter 72, 74 is also added.

Figure 4:
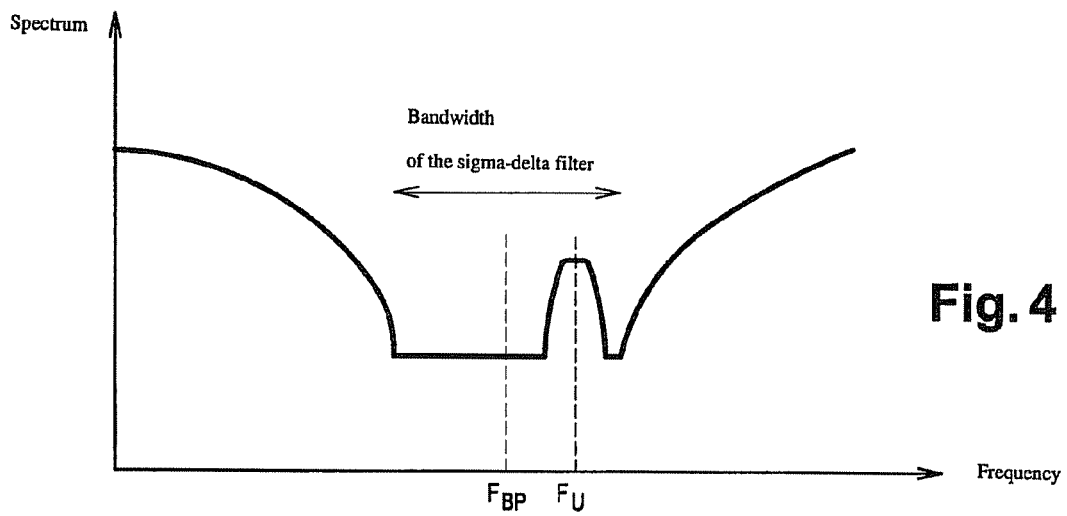
FIG. 4 is an output spectrum of a sigma-delta filter which forms part of the second embodiment.

Note that frequencies $f_C$ and $f_{BP}$ are not identical because $f_C$ refers to the frequency of the central transmission channel at the level of the antenna whereas $f_{BP}$ refers to the mid-band frequency of the sigma-delta filter in bandpass mode. If $f_C$ is sufficiently low, the distinction between $f_C$ and $f_{BP}$ may possibly be lost. FIG. 4 illustrates the most general case of the spectrum of the output signal from the sigma-delta filter where one can see $f_U$ and $f_{BP}$, but $f_C$ is at a much higher frequency.

The useful information is thus essentially comprised within a frequency band centred on frequency $f_U = f_{BP} + (f_{CH} - f_C)$.

The vector product makes it possible to adjust the amplitude level of the signals on the inputs of the sigma-delta filters. In fact, $R_P$ and $R_N$ are, respectively, proportional to the signals:

$$R_P = Re[(I^P + j.Q^P) * A * e^{j\omega_U t}]$$

$$R_N = Re[(I^N + j.Q^N) * A * e^{j\omega_U t}]$$

Furthermore, in cases where transmission frequencies which are compatible with the maximum operating frequency of the sigma-delta filters are chosen (typically frequencies less than 2 GHz) repetition over-sampler 80 and convolution circuit 82 can be omitted and the outputs of sigma-delta filters 72, 76 are connected to digital-to-analogue converters 84, 86 directly.

Figure 5:
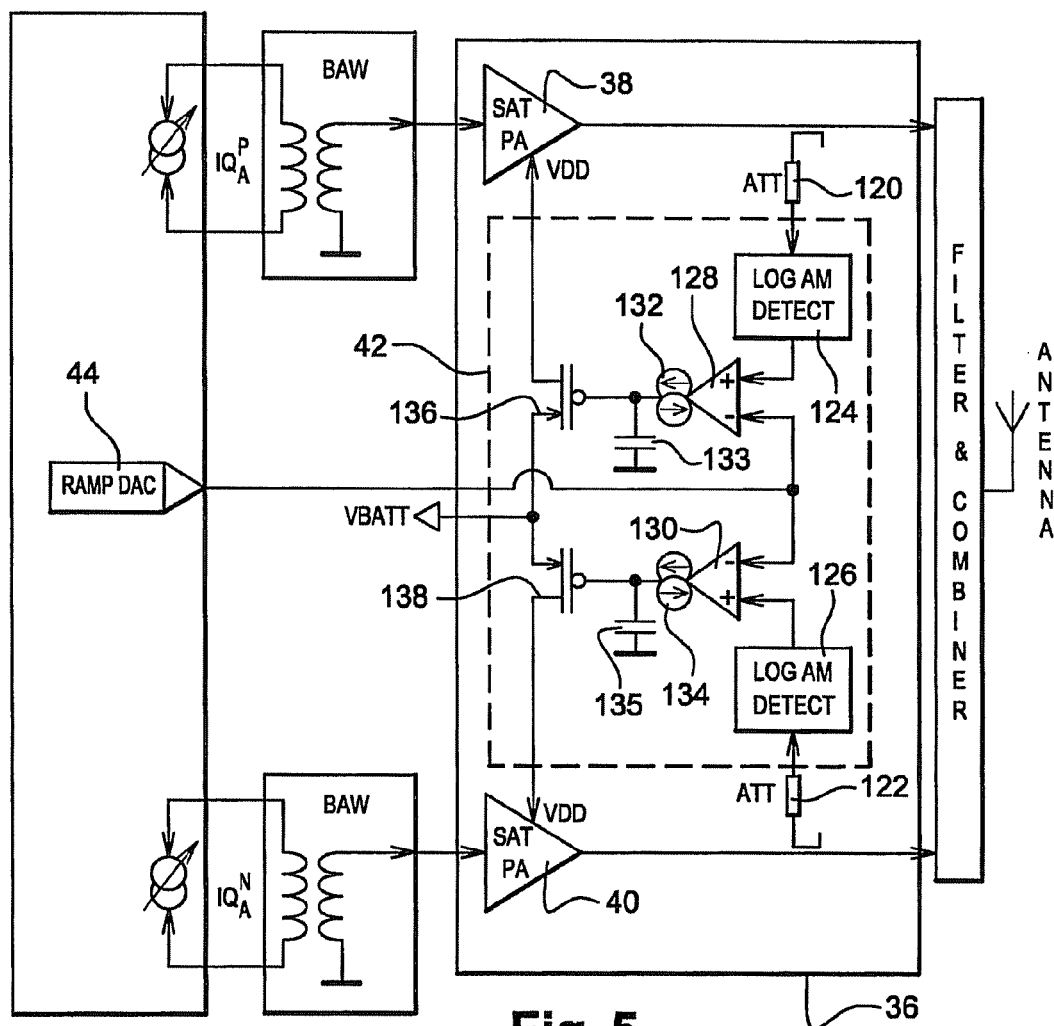
FIG. 5 is a more detailed schematic view of the module that controls the power amplifiers which are part of the architecture shown in FIG. 1.

FIG. 5 is a schematic view of gain control module 42 of amplification stage 36.

One advantage of converting the amplitude-modulated signals into constant-envelope signals is the ability to perform amplification in saturation or compression mode, thereby making it possible to adjust the saturation point as a function of the power of the signal which is to be transmitted.

Generally speaking, the average transmitting power of a mobile terminal, such as a cell phone for example, is continually adjusted depending on the terminal's location relative to the nearest base station. In order to optimise the transmit power, the base station indicates to the terminal the power level at which it must transmit. The terminal must therefore be equipped with means enabling it to control the average transmit power.

For this purpose, gain control module 42 of the system according to the invention comprises a directional coupler 120, 122 (associated with each amplifier 38, 40) which picks up part of the output signal from amplifier 38, 40. Power measuring circuit 124, 126 is connected to directional coupler 120, 122 and measures the power transmitted by amplifier 38, 40 as a function of the signal picked up by coupler 120, 122 in a manner which is already known in itself.

Comparator 128, 130 is also connected to the output of measuring circuit 124, 126 and receives the gain set point for amplifiers 38, 40 from module 44. The measured output power for amplifier 38, 40 is thus compared with the gain set point provided by module 44.

The difference between the two inputs of the comparator control a current source which charges or discharges capacitor 133, 135 to which it is connected. The voltage across the terminals of capacitor 133, 135 determines the gate voltage of PMOS power transistor 136, 138, the source of which is connected to a constant voltage VBATT and the drain of which feeds current to amplifier 38, 40.

When the transmitting power is too high, current source 132, 134, is active in the outward direction and therefore continuously charges the gate voltage of transistor 136, 138. This has the effect of reducing the current which the transistor feeds to amplifier 38, 40 and therefore reduces the power transmitted by the amplifier until the voltages across the terminals of the comparator balance out. If the transmitted power is too low, this procedure is reversed. The system is therefore stable The digital circuit has a digital-to-analogue converter which is referred to as RAMP DAC; it is connected to the negative input of the comparator.

When the circuit outputs a higher RAMP DAC set point value, the negative potential difference across the terminals of comparator 128, 130 produces an incoming current source which discharges the capacitor. This has the effect of reducing the gate voltage, increasing the current supplied by transistor 136, 138 and increasing the power transmitted by the amplifier. The opposite applies if the RAMP DAC set point value is lower.

Figure 6:
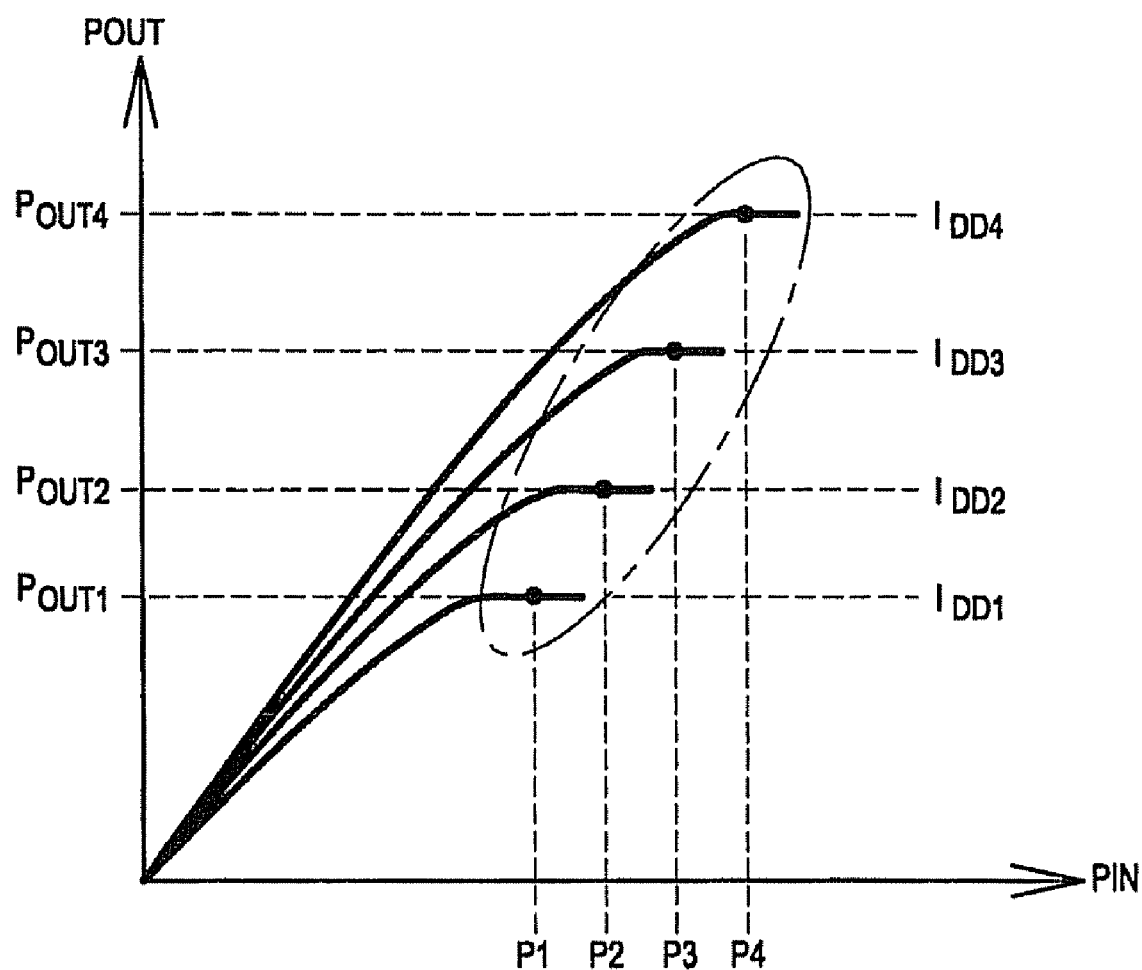
FIG. 6 is an amplification curve plot.

In addition, power amplification module 36 is designed so that amplifiers 38, 40 operate continuously in saturation mode. More especially and as shown in FIG. 6, the power amplification curves of an amplifier (x-axis represents the power of the amplifier's input signal, y-axis represents the power of the amplifier's output signal) are parameterised by current $I_{DD}$ which feeds the amplifier.

A weaker current $I_{DD}$ results in a lower saturation point and a stronger current $I_{DD}$ results in a higher saturation point.

The two variables for adjusting the system are the RAMP DAC set point and the signal's input power. These are factory calibrated so that the amplifiers always operate optimally in their saturation region.

When the system needs to transmit at higher power, for example POUT4, the RAMP DAC set point and input power P4 are adjusted so that the operating point is set to a characteristic (POUT, PIN) which ensures saturation for power level POUT4.

When the system needs to transmit at lower power, for example POUT1, the RAMP DAC set point is reduced and input power P1 is limited so that the operating point is a saturation point which is the point of maximum efficiency.

The structure of a BAW-CRF filter is described below in greater detail in relation to FIGS. 7 to 11.

BAW-CRF filters consist of a stack of several bulk acoustic wave resonators which are coupled by an assembly of acoustically passive layers. Each resonator comprises a piezo-electric layer which is sandwiched between two electrodes.

Figure 7:
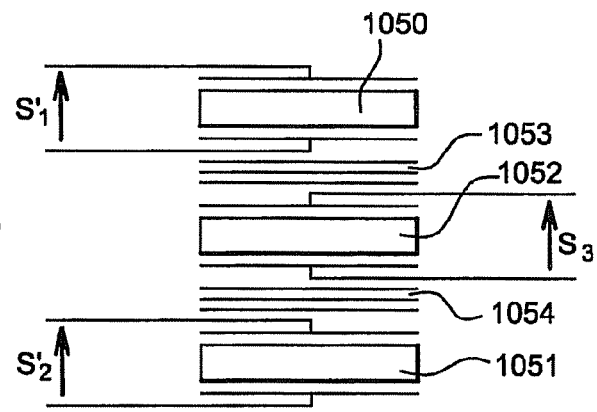
FIGS. 7 and 8 are schematic cross-sectional views of a BAW-CRF filter which forms part of the filtering and recombining circuit of the system according to the invention.

Such filters operate, in simple teens, in accordance with the structures shown schematically in FIG. 7

Figure 10:
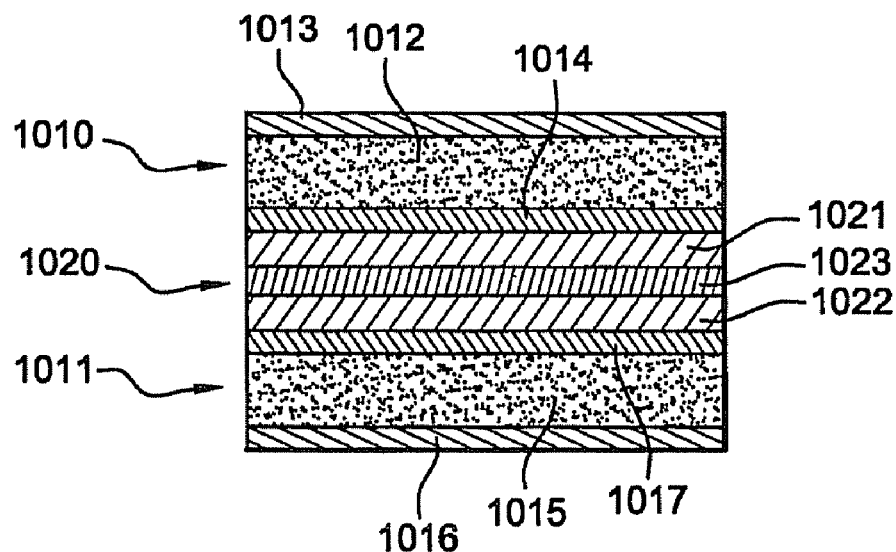
FIGS. 10, 11 and 12 are similar views showing other embodiments.

Such a filter structure comprises two resonators 1010, 1011. Each resonator comprises a central piezo-electric layer 1012 which is sandwiched between two electrodes 1013, 1014, as shown in FIG. 10. The second resonator 1011 comprises a similar structure with a central layer 1015 sandwiched between two electrodes 1016, 1017.

The two resonators 1010, 1011 are separated by an assembly of layers. This assembly of layers 1020 includes low-acoustic impedance layers 1021, 1022 between which high-acoustic impedance layers 1023 are interposed.

In the example shown, the number of layers represented is three but this number can be greater, depending on the particular application. The materials used, classically, are dielectric materials in the case of the low-acoustic impedance layers or metallic materials in the case of the high-acoustic impedance layers. Thus, an electrical signal applied across the two electrodes 1013, 1014 of the first resonator causes generation of an acoustic field. This acoustic field passes through all the coupling layers 1021-1023 in the frequency band defined by the acoustic properties of these stacked layers.

The acoustic field thus acts on central layer 1015 of the second resonator and causes an electrical signal across the terminals of electrodes 1016, 1017 of the second resonator.

Figure 11:
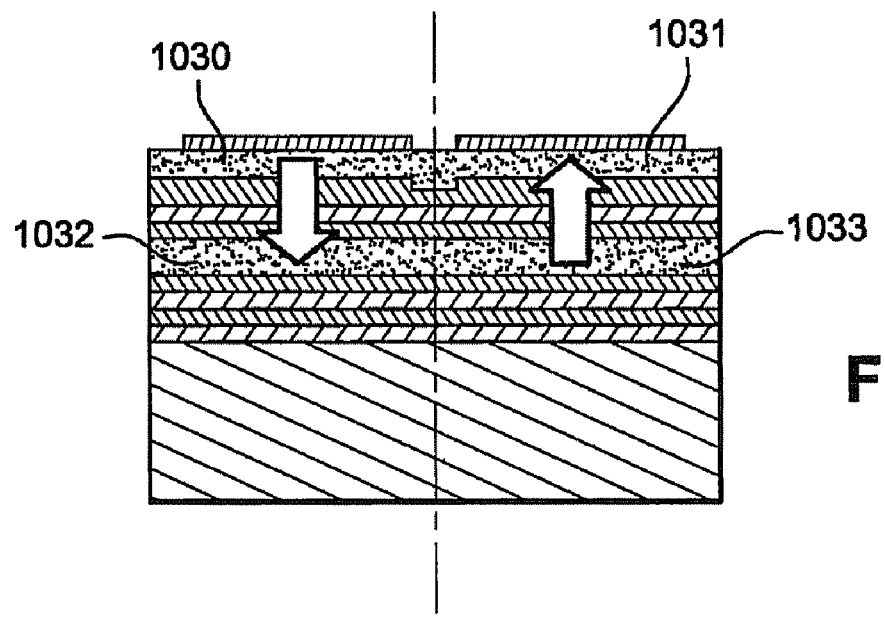

In one particular embodiment shown in FIG. 11, input resonator 1030 and output resonator 1031 may be coupled not directly, as in the case of FIG. 7, but indirectly via an assembly of additional resonators 1032, 1033. These intermediate resonators 1032, 1033 respectively receive and transmit the acoustic fields received from input resonator 1030 and routed to output resonator 1031 respectively.

As shown in FIG. 7 which corresponds advantageously to recombining module 50 in FIG. 1, two signals $s'_1$ and $s'_2$, corresponding, for example, to the analogue output voltages of amplifiers 38, 48 of the system according to the invention, are applied respectively to input resonators 1050, 1051. The acoustic fields generated by each of these input resonators 1050, 1051 propagate in output resonator 1052 via stacked acoustic layers 1053, 1054. In this case, coupling between the input resonator and the output resonator is acoustic only. The acoustic fields are therefore summed in the output resonator which outputs an output signal $S_3$ which is equivalent to the sum of the two signals $s'_1$ and $s'_2$, less any acoustic losses.

In the case in question, input resonator 1050 and output resonator 1051 must be produced by stacking them one on top of the other on the axis along which the acoustic energy propagates.

Figure 8:
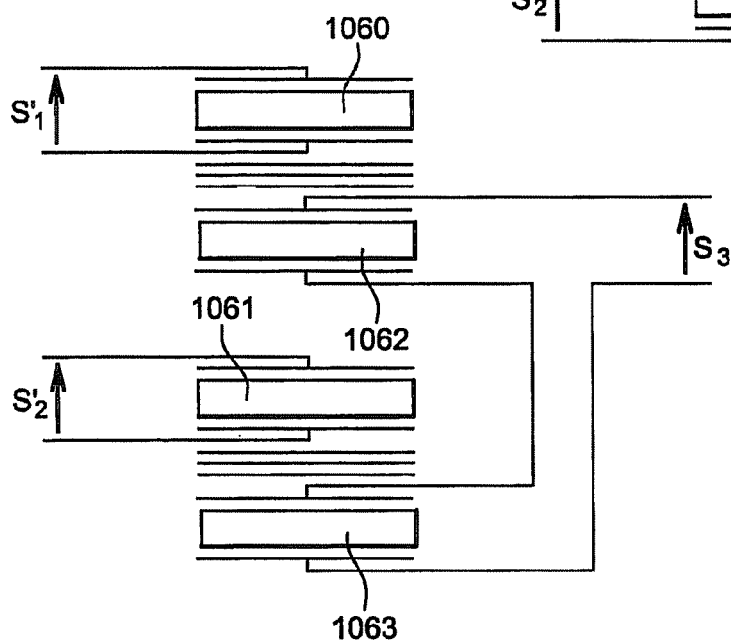

In a second embodiment shown in FIG. 8, the two input resonators 1060, 1061 are individually connected to two output resonators 1062, 1063. Each output resonator 1062, 1063 therefore produces an electrical signal S3 which corresponds respectively to the amplified signals $s'_1$, $s'_2$.

Output resonators 1062, 1063 are electrically connected in series in such a way that the output signal corresponds to the sum of the voltages generated by each of the output resonators 1062, 1063. Summing of the two amplified signals is therefore obtained by connecting the two output resonators in series.

Figure 9:
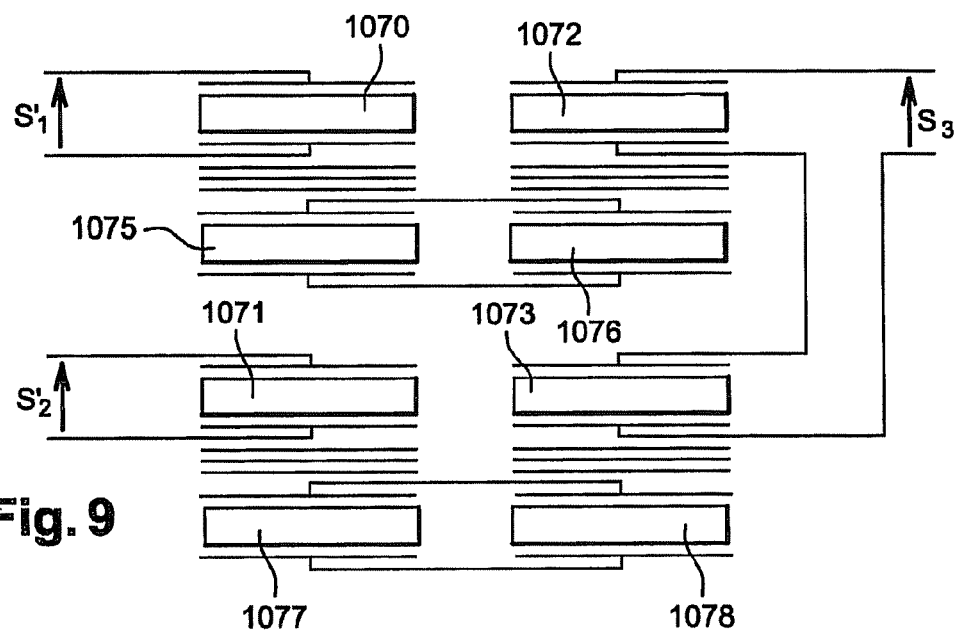
FIG. 9 is a view showing a first embodiment of the filtering and recombining circuit in FIG. 2.

In an alternative embodiment shown in FIG. 9, input resonators 1070, 1071 are not directly acoustically connected to output resonators 1072, 1073. In contrast, the assembly of additional resonators 1075, 1076, 1077, 1078 ensure transmission of the acoustic field between the input resonators and the output resonators.

As in the embodiment shown in FIG. 8, this makes it possible to produce output and input resonators which are located in the same plane. The filter structure can therefore be regarded as a two-stage structure.

Figure 12:
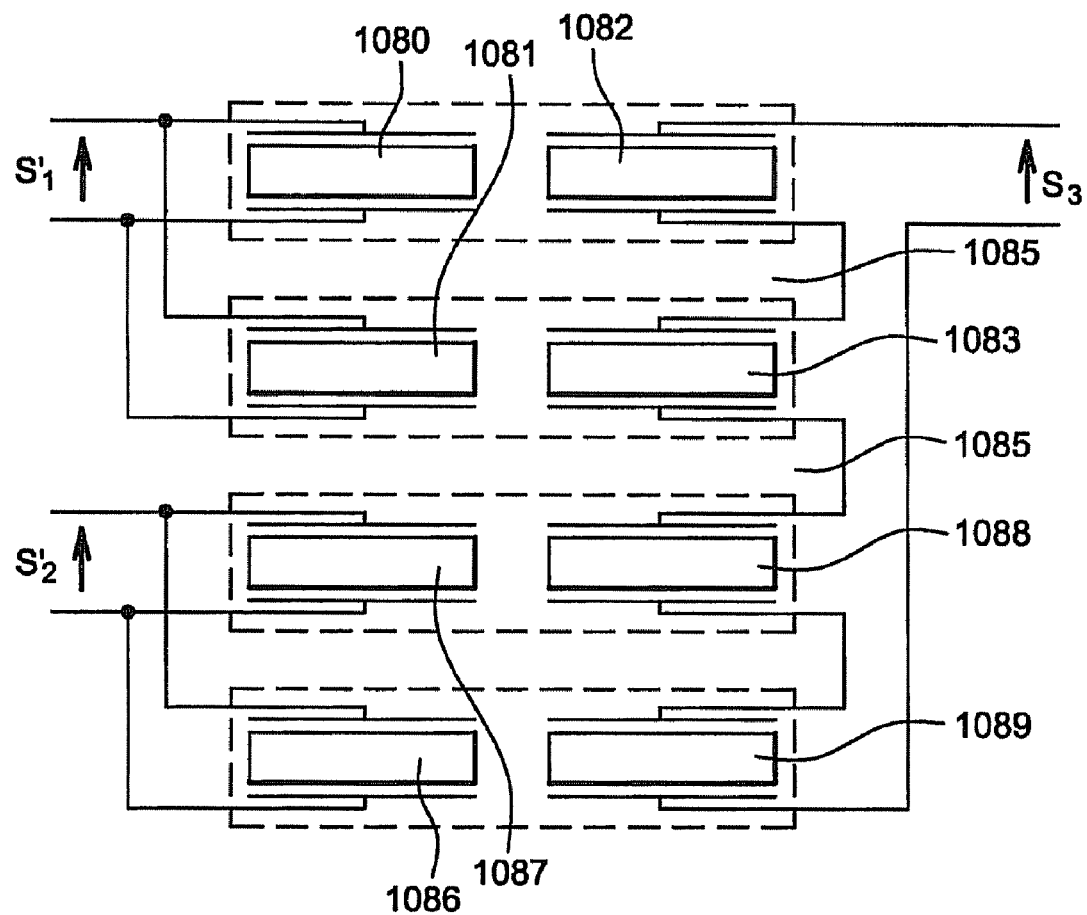

According to another aspect of the invention, it is possible to produce a combination of BAW-CRF filters in such a manner as to ensure impedance matching to the output impedance which, generally speaking, is determined by the transmitting antenna. Thus, as shown in FIG. 12, input signal $s'_1$ feeds two input resonators 1080, 1081, the electrodes of which are in parallel. The impedance seen at the level of the input is therefore equivalent to half the impedance of each of the resonators.

These input resonators 1080, 1081 are connected to output resonators 1082, 1083 via a resonator stage 1085 in the embodiment shown. The same applies to the processing of the second amplified signal which feeds two input resonators 1086, 1087 which are acoustically coupled to output resonators 1088, 1089. The four output resonators 1082, 1083, 1088, 1089 are also connected in series so that the output impedance is substantially equivalent to four times the per-unit impedance of one output resonator.

This setup makes it possible to ensure impedance conversion between the stage input and output so that it can be matched to the required impedance value.

Thus, one can achieve the power level required in the transmission standards for mobile applications whilst retaining the low bias voltage levels which are generally used with this type of filter structure.

Obviously, more complex setups which include a different number of resonators can be implemented depending on the sought-after values.

In addition, the insertion losses of the BAW-CRF filters are very low, of the order of 2 to 3 decibels; this makes it possible to reduce energy dissipation at the level of the filtering and recombining circuit.

Moreover, thanks to the considerable selectivity of the BAW-CRF filters, it is possible to reduce, very significantly, the generation of interference or quantisation noise caused by the sigma-delta filters of the digital radiofrequency module outside the chosen transmission frequency band.

In addition, the BAW-CRF filters described above are especially advantageous in terms of their overall dimensions and cost because they can include components mounted using flip-chip technologies.

Although a system according to the invention having a filtering and recombining circuit which uses BAW-CRF is described above, other types of filters can be envisaged as long as they perform selective filtering of the quantisation noise generated by the sigma-delta filters outside the frequency band which is of interest.

For example, Surface Acoustic Wave (SAW) filters can be used instead of BAW-CRF filters 32, 34 upstream from amplification stage 36.

The invention achieves:

radiofrequency transmission of amplitude-modulated signals over a wide power range which can be as much as +30 dBm while guaranteeing amplification remains unaffected by amplitude distortion phenomena and moderate power consumption by using the "outphasing" technique combined with amplifiers which operate in saturation or compression mode;

extension of the functional scope of a digital radiofrequency modulator up to radio frequencies. Thus, compared with analogue radiofrequency modulation circuits according to the prior art, the invention achieves better integration of functional components over a smaller surface area, lower energy consumption, good reconfigurability which makes it possible to switch rapidly from one type of communication to another, especially in terms of data format and transmission frequency band, improved immunity to temperature and frequency variations, the elimination of cross coupling between signals generated by the system and a lower failure rate due to the use of digital functional components instead of analogue functional components;

reconfigurability, flexibility and high speed. In fact, multistandard transmission systems require a radio transmission architecture which can adapt to its environment. For instance, communication according to the WIFI standard may be required inside a building and communication according to the EDGE standard may be required outside a building. Transmission systems according to the invention are capable of providing various solutions to users and switching from one communication standard to another without any break in communication. The transmission system according to the invention is thus especially suitable for opportunistic communication in a deregulated communication environment because it is capable of reconfiguring itself rapidly and thereby exploiting temporal, geographical or spectral opportunities which are time-limited.

reduced level of out-of-band interference. In fact, thanks to the highly selective filtering applied by the filtering and recombining circuit, quantisation noise, interference and stray signals outside the frequency band which is currently being used by a system according to the invention are substantially eliminated. Thus, operation of the system according to the invention does not interfere with communication in adjacent frequency bands;

reduced overall dimensions. In fact, changing over to an all-digital radiofrequency modulator (implemented, for instance, using CMOS technologies in the form of ASIC or FPGA circuits) facilitates integration of the radiofrequency modulator in circuits located upstream from it, such as a baseband circuit for example. Similarly, the modulator according to the invention can be associated with a dedicated signal processing computer. Also, the selective BAW-CRF filters are compact compared with SAW filters according to the prior art. The use of analogue BAW-CRF filters does not impose constraints in terms of overall size.

The invention claimed is:

1. A radiofrequency transmission system comprising:

means of producing a complex digital signal S quantised on N bits;

means of transforming the complex digital signal S into two complex digital signals $S_{LINC}^P$ and $S_{LINC}^N$ which have an identical and constant envelope that is phase-shifted with respect to one another, wherein $S=S_{LINC}^P+S_{LINC}^N$;

a digital processing pathway associated with each of the two complex digital signals with a constant envelope and comprising at least some filtering means of a sigma-delta type for quantising on M bits signals travelling in the processing pathway, M being less than N;

digital-to-analogue conversion means for converting the outputs of digital processing pathways into analogue signals;

means of selectively filtering of a bandpass type the analogue signals in a predetermined transmission frequency band;

means of amplifying the filtered analogue signals; and means of recombining the amplified analogue signals.

2. The radiofrequency transmission system as claimed in claim 1, wherein the means of producing comprises means of generating a complex digital signal quantised on N bits and sampled at a first predetermined frequency and means of over-sampling the complex digital signal sampled at the first frequency at a second predetermined frequency.

3. The radiofrequency transmission system as claimed in claim 1, wherein the digital processing pathway further comprises:

means of repetition over-sampling capable of inserting L−1 zeroes between each sample of a digital input signal received by said means; and convolution means capable of convoluting the digital output signals of the repetition over-sampling means with a sequence quantised on M bits having a length equal to L or 2L samples and sampled L times the second frequency.

4. The radiofrequency transmission system as claimed in claim 1, wherein the sigma-delta type filtering means operates in baseband mode.

5. The radiofrequency transmission system as claimed in claim 1, wherein the sigma-delta type filtering means operates in bandpass mode.

6. The radiofrequency transmission system as claimed in claim 1, wherein the digital processing pathway further comprises channel selection means.

7. The radiofrequency transmission system as claimed in claim 1, wherein the digital processing pathway further comprises means capable of producing a vector product between a complex digital signal received on an input and a phasor with a predetermined constant amplitude.

8. The radiofrequency transmission system as claimed in claim 1, wherein the digital processing pathway comprises means of selecting the real part of the complex digital signal with a constant envelope.

9. The radiofrequency transmission system as claimed in claim 1, wherein the selective filtering means of the bandpass type comprises BAW-CRF filters.

10. The radiofrequency transmission system as claimed in claim 1, wherein the means of amplification comprises power amplifiers which operate in saturation or compression mode.

11. The radiofrequency transmission system according to claim 1, wherein the output impedance of digital-to-analogue conversion means is matched to the input impedance of selective filtering means.

* * * * *